(12) United States Patent
Chau et al.

(10) Patent No.: US 11,631,634 B2
(45) Date of Patent: Apr. 18, 2023

(54) LEADLESS SEMICONDUCTOR PACKAGE AND METHOD OF MANUFACTURE

(71) Applicant: NEXPERIA B.V., Nijmegen (NL)

(72) Inventors: On Lok Chau, Nijmegen (NL); Fei Wong, Nijmegen (NL); Ringo Cheung, Nijmegen (NL); Billie Bi, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 17/190,508

(22) Filed: Mar. 3, 2021

(65) Prior Publication Data

US 2021/0287972 A1  Sep. 16, 2021

(30) Foreign Application Priority Data

Mar. 11, 2020  (EP) ..................... 20162403

(51) Int. Cl.
*H01L 23/495* (2006.01)
*H01L 21/56* (2006.01)
*H01L 23/31* (2006.01)

(52) U.S. Cl.
CPC ...... *H01L 23/49575* (2013.01); *H01L 21/561* (2013.01); *H01L 23/3107* (2013.01); *H01L 23/49517* (2013.01); *H01L 23/49582* (2013.01)

(58) Field of Classification Search
CPC ............. H01L 23/49575; H01L 21/561; H01L 23/3107; H01L 23/49517; H01L 23/49582; H01L 2224/32245; H01L 2224/40245; H01L 2224/45124; H01L 2224/45139; H01L 2224/45147; H01L 21/4828; H01L 2224/45144; H01L 2224/48091; H01L 2224/48247; H01L 2224/48465; H01L 2224/73265; H01L 23/49541; H01L 23/4951; H01L 21/4825; H01L 23/4952

(Continued)

(56) References Cited

U.S. PATENT DOCUMENTS

2007/0215990 A1* 9/2007 San Antonio ....... H01L 21/4832
257/666
2015/0294925 A1 10/2015 Shih
(Continued)

FOREIGN PATENT DOCUMENTS

EP  2980845 A1  2/2016

OTHER PUBLICATIONS

Extended European Search Report for corresponding European application EP20162403.8 9 pages, dated Jul. 20, 2020.

*Primary Examiner* — Kimberly N Rizkallah
*Assistant Examiner* — Dilinh P Nguyen
(74) *Attorney, Agent, or Firm* — Ruggiero, McAllister & McMahon LLC

(57) ABSTRACT

This disclosure relates to a leadless packaged semiconductor device including a top and a bottom opposing major surfaces and sidewalls extending between the top and bottom surfaces, the leadless packaged semiconductor device further includes a lead frame structure including an array of two or more lead frame sub-structures each having a semiconductor die arranged thereon, and terminals and a track extended across the bottom surface of the semiconductor device. The track provides a region for interconnecting the semiconductor die and terminals, and the track is filled by an insulating material to isolate the lead frame sub-structures.

20 Claims, 6 Drawing Sheets

(58) Field of Classification Search
USPC .......................................................... 257/666
See application file for complete search history.

(56) References Cited

U.S. PATENT DOCUMENTS

| | | | |
|---|---|---|---|
| 2016/0035651 A1* | 2/2016 | Leung ................... | H01L 21/561 |
| | | | 438/112 |
| 2016/0126162 A1 | 5/2016 | Leung et al. | |
| 2016/0372403 A1* | 12/2016 | Lam ........................ | H01L 25/50 |
| 2018/0204787 A1 | 7/2018 | Yamaguchi | |
| 2019/0189542 A1* | 6/2019 | Bemmerl ................ | H01L 23/31 |

* cited by examiner

LEADLESS SEMICONDUCTOR PACKAGE AND METHOD OF MANUFACTURE

CROSS REFERENCE TO RELATED APPLICATION

This application claims the benefit under 35 U.S.C. § 119(a) of European Application No. 20162403.8 filed Mar. 11, 2020 the contents of which are incorporated by reference herein in their entirety.

BACKGROUND OF THE DISCLOSURE

1. Field of the Disclosure

The present disclosure relates to a method of forming a leadless packaged semiconductor device. The disclosure also relates to a leadless packaged semiconductor device.

2. Description of the Related Art

Leadless packaged semiconductor devices are known to provide advantages over leaded packages. Those advantages include better electrical performance in terms of reduced lead inductance, good heat dissipation by use of an exposed thermal pad to improve heat transfer to a Printed Circuit Board (PCB), reduced package thickness and smaller footprint, which reduces the area occupied on a PCB. Examples of leadless packaged semiconductor devices include Quad-Flat No-lead (QFN) devices and Dual Flat No-lead (DFN) devices. However, a disadvantage of leadless packaged semiconductor devices is that inspection of solder joints when mounted on a PCB can be difficult. Conventional inspection techniques utilise so-called Automated Optical Inspection (AOI) systems, whereby a camera scans the leadless packaged semiconductor devices mounted on the PCB for a variety of defects such as open circuit connections, short circuit connections, thinning of the solder connections and incorrectly placed devices. Due to the semiconductor device Input/Output (I/O) terminals being arranged on the bottom of the device, and therefore hidden from view when the device is mounted a PCB, it is not generally possible to use A0I systems with leadless semiconductor devices. Automatic XRay Inspection (AXI) systems may allow inspection of solder joints, however AXI systems are expensive.

A solution allowing solder joints to be inspected by AOI is to include a metal side pads which extend from the device I/O terminals on the bottom of the device at least partially up external sidewall of the device. Typically, the metal side pads may be formed of tin, lead or tin-lead alloys. During soldering processes for attaching the device to the PCB, the solder will wet the I/O terminal on the bottom of the device and also the metal side pads. As a result, a portion of the solder joint will be visible, which allows the inspection by AOI techniques. The solder joint may be considered good, provided that the metal side pads are correctly soldered even if the I/O terminal is not correctly soldered to the PCB.

In addition to ease of inspection, metal side pads may reduce tilting of the device when mounted on a PCB. Metal side pads may also improve shearing and bending performance because of the increased soldered area.

Typically, a package structure will comprise an array of device dies embedded in an encapsulation layer. The device dies will be connected to a lead frame by any appropriate means, such as eutectic bonds. The process of forming a such leadless device involves dividing a two-dimensional array of encapsulated integrated circuits into individual semiconductor device packages using a series of parallel row cuts and parallel column cuts. The first series of parallel singulation cuts extend fully through the lead frame and encapsulation layer defining rows of the array. In such a process the I/O terminals will be exposed and since the I/O terminals are mutually electrically connected the exposed I/O terminals may be electroplated to form the metal side pads. The electrical connection is necessary to maintain electrical continuity so that the electroplating process can be achieved.

After electro-plating metal side pads, a second series of parallel singulation cuts is made extending fully through the lead frame and encapsulation layer. This separates the columns of the array thereby providing singulated packages.

However, for leadless semiconductor devices having one or more functional dies and at least three I/O terminals located at one sidewall of the device and at least two I/O terminals located at an opposing sidewall, it is not possible to form side pads by electroplating according to above process because the singulation cutting sequence requires that middle I/O terminals located at one sidewall of the device formed on a lead frame structure on lead frame will be electrically isolated.

FIG. 1a shows a typical lead frame structure 10 formed of a series of lead frame sub-structures.

Prior to the first singulation cutting sequence to define rows, as discussed above, each of the six I/O terminals 12, 14 and 16 (three I/O terminals on two opposing sides of the device) for a specific device lead frame are electrically interconnected connected since they will be monolithically formed from a single piece of metal, typically by a photo etching process on sheet metal. Referring now to FIG. 1b, following the first cutting sequence (indicated by lines A), I/O terminals 12, 14 will be detached from the lead frame structure 10, and therefore it will not be possible to electroplate the I/O terminals 12, 14 to form metal side pads because they will be mechanically detached and electrically isolated from the lead frame structure.

Following the second cutting sequence which is substantially orthogonal to the first cutting sequence, (indicated by lines B) each individual sub-lead frame will be singulated from the lead frame structure 10.

The disadvantage of the leadless packaged semiconductor devices as described above is that it is limited to maximum of four terminals having the metal side pads.

SUMMARY

Various example embodiments are directed to the disadvantage as described above and/or others which may become apparent from the following disclosure.

According to an embodiment of this disclosure a leadless packaged semiconductor device comprises a top and a bottom opposing major surfaces and sidewalls extending between the top and bottom surfaces. It further comprises a lead frame structure that comprises an array of two or more lead frame sub-structures, each of them having a semiconductor die arranged thereon. Furthermore, the leadless packaged semiconductor device comprises terminals and a track extended across the bottom surface of the semiconductor device. The track provides a region for interconnecting the semiconductor die and terminals during manufacture. The track is filled by an insulating material so to isolate the lead frame sub-structures.

According to an embodiment of this disclosure each of the terminals comprises a respective metal side pad.

According to an embodiment of this disclosure the leadless packaged semiconductor device may comprise four or more terminals.

According to an embodiment of this disclosure the insulating material is a solder mask or an encapsulant.

According to an embodiment of this disclosure the semiconductor die and the respective terminal can be connected both mechanically and electrically.

According to an embodiment of this disclosure the terminals are plated with an electroplating material such as a tin, a lead, or a tin-lead compound.

The disclosure also relates an automotive part comprising a leadless packaged semiconductor device as specified in one of the previous embodiments. This is especially useful since in the automotive industry AOI systems are used.

One embodiment of the disclosure relates to a method of forming a leadless packaged semiconductor device, the device comprises a lead frame structure comprising an array of lead frame sub-structures each having a semiconductor die arranged thereon. The method comprises the following steps:

providing electrical connections between terminals of said lead frame sub-structures and said lead frame structure;

providing an encapsulation layer to encapsulate the lead frame sub-structures and the respective semiconductor dies;

performing a first series of parallel cuts extending through the lead frame structure and the encapsulation layer to expose a side portion forming terminals;

electro-plating the terminals to form metal side pads;

forming a series of grooves in the lead frame structure, wherein the grooves extend across the bottom surface of the leadless packaged semiconductor device;

filling the grooves with an insulating material; and performing a second series of parallel cuts angled with respect to the first series of parallel cuts, the second series of cuts extending through the lead frame structure and the encapsulation layer to singulate the leadless packaged semiconductor device.

In another embodiment of this disclosure the method can also comprise a deflashing step, so to remove any remaining encapsulation layer from the terminals. Such a deflashing step is performed before electro-plating step.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

DETAILED DESCRIPTION

Figure 1A:
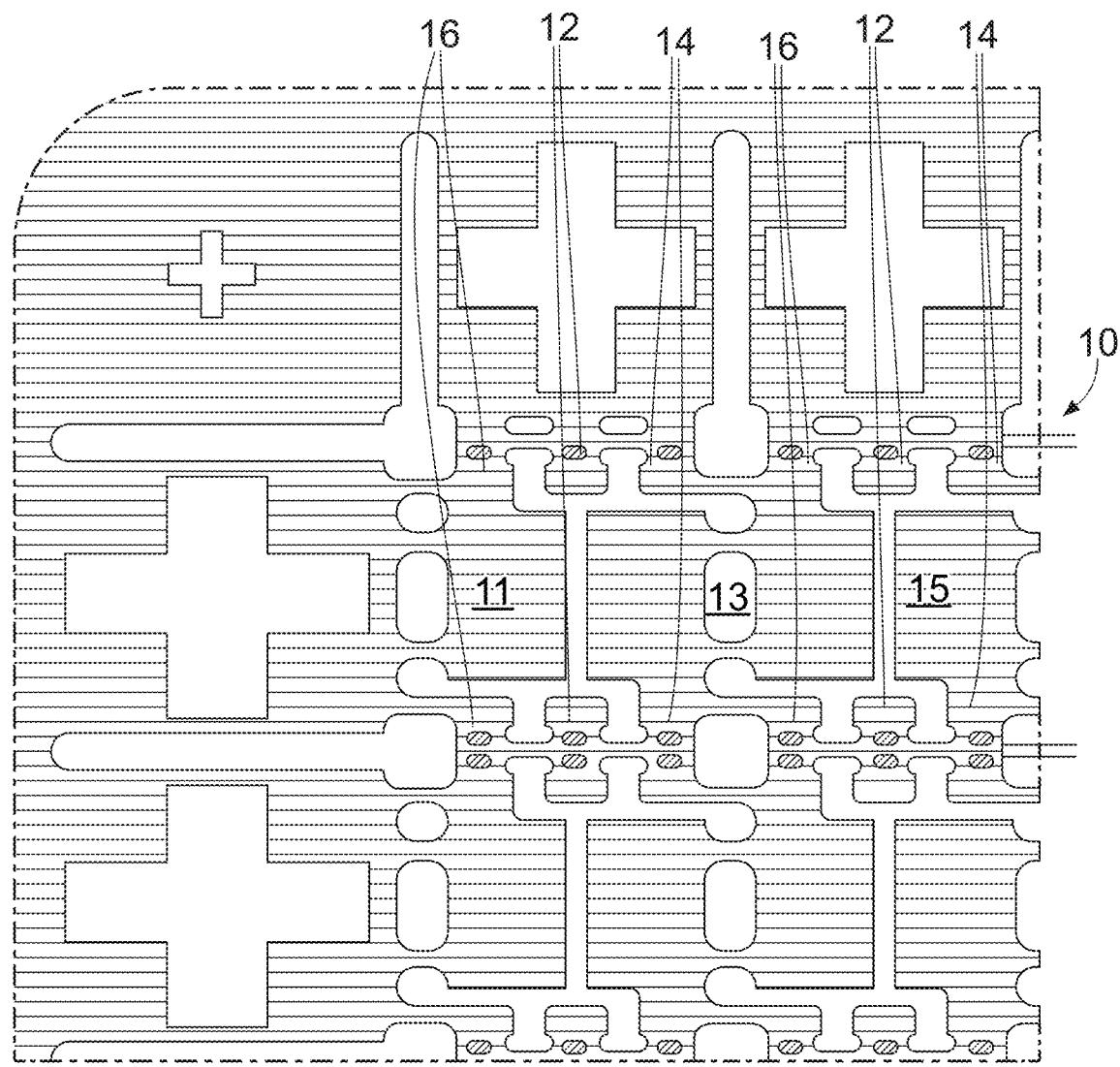
FIG. 1a shows a known lead frame structure.
Figure 1B:
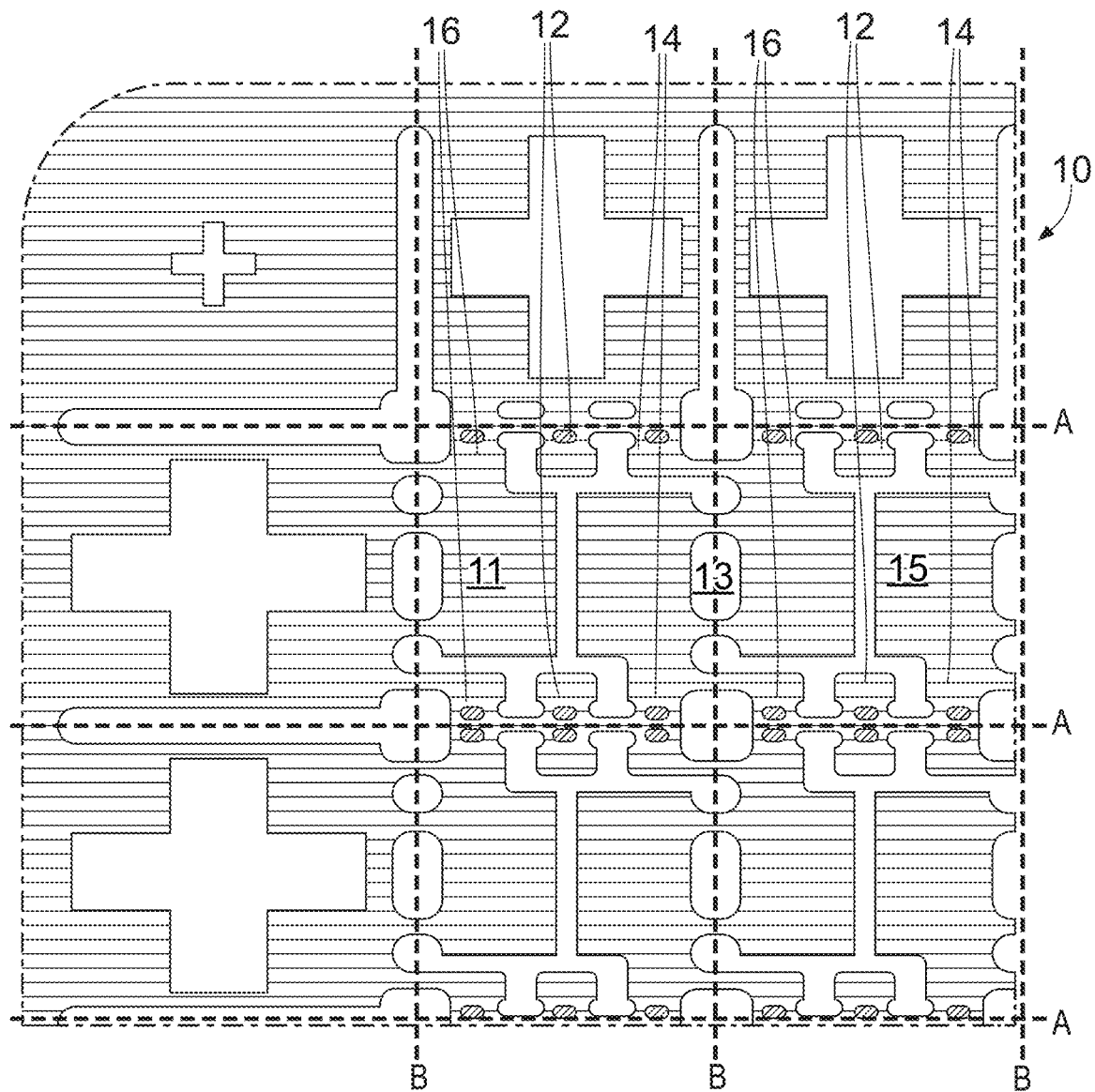
FIG. 1b shows a known lead frame structure indicating the location of singulation cuts.
Figure 2:
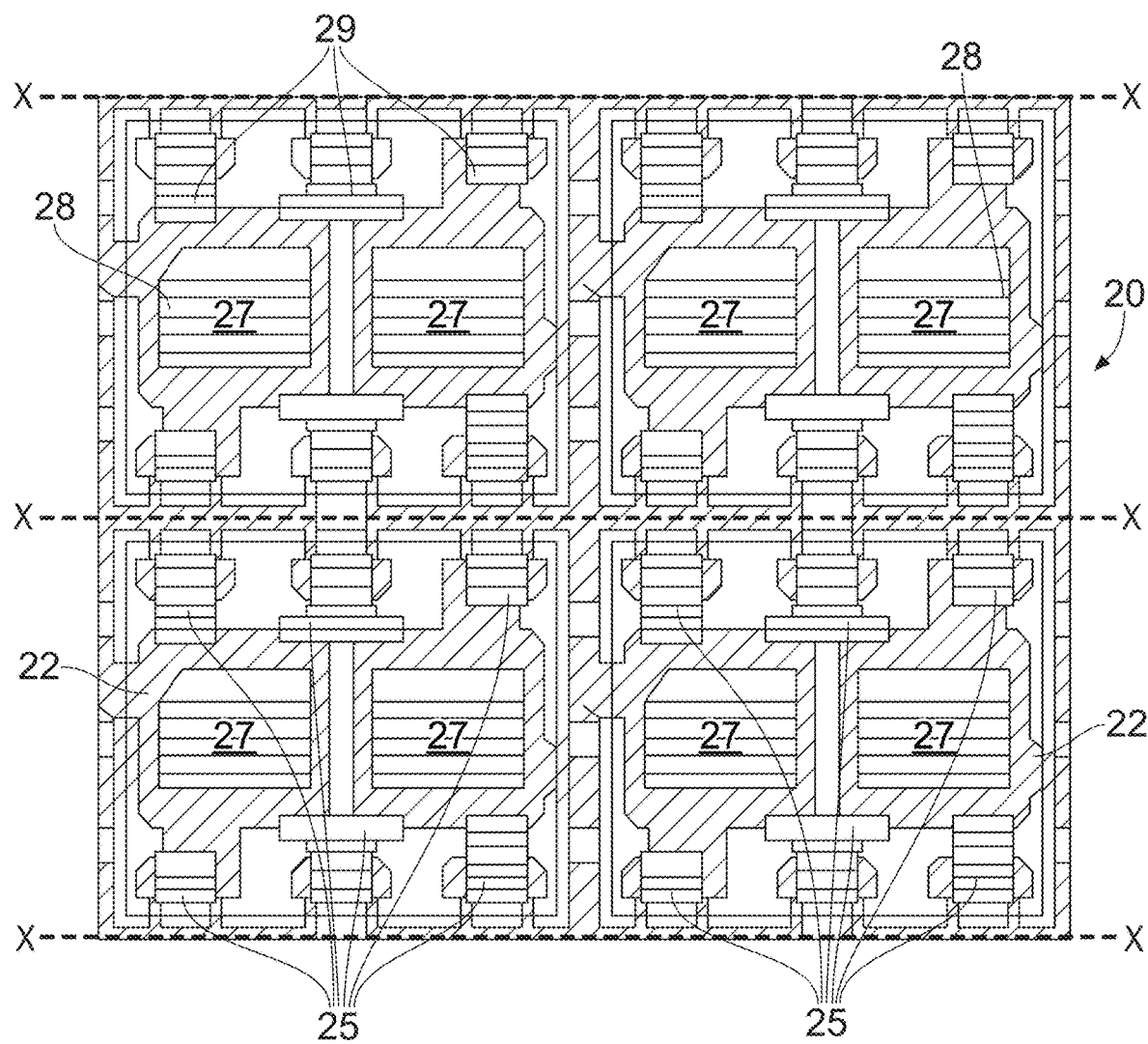
FIG. 2 illustrates a lead frame structure according to embodiments.

In the figures and the following description like reference numerals refer to like features. In overview, the lead frame structure 20, known as a unit structure, according to an embodiment is illustrated in FIG. 2. The lead frame structure 20 is formed of a two-dimensional (2D) array of interconnected sub-structures each of which constitutes single lead frames 22, 28 for a leadless packaged semiconductor device when singulated. In this example, each of the lead frames comprises two sets of three I/O terminals 25, however the skilled person will appreciate that the number of I/O terminals may vary as required by the package type. Each of the lead frames 22, 28 also comprises at least two die attach regions 27 onto each of which a semiconductor device die (not illustrated in FIG. 2) may be attached, as discussed below. Each one of the two set of I/O terminals are associated with each one of the die attach regions 27 so that appropriate connections can be made to the device die. Applications requiring two dies include dual transistors arrangements such as cascode transistors or dual diodes.

The die attach region 27 is integrally connected to respective I/O terminals 25, however, the die attach region 27 is configured and arranged to be disconnected from the I/O terminal 25 following the singulation process as discussed below. Prior to singulation each of the I/O terminals 25 are integrally connected to the respective die attach region 27 my means of for example tie bars 29. The tie bars 29 connecting the die attach regions 27 to the I/O terminals 25 are arranged to be severed or broken during the singulation process, as discussed below. The I/O terminals 25 are arranged such that they are formed along two parallel axes, known as the lead side axes, defining a row in the array or lead frames 22, 28. The lead frame structure 20 is typically formed from a sheet of metal copper alloy coated with palladium gold by a photo etching process.

Figure 3:
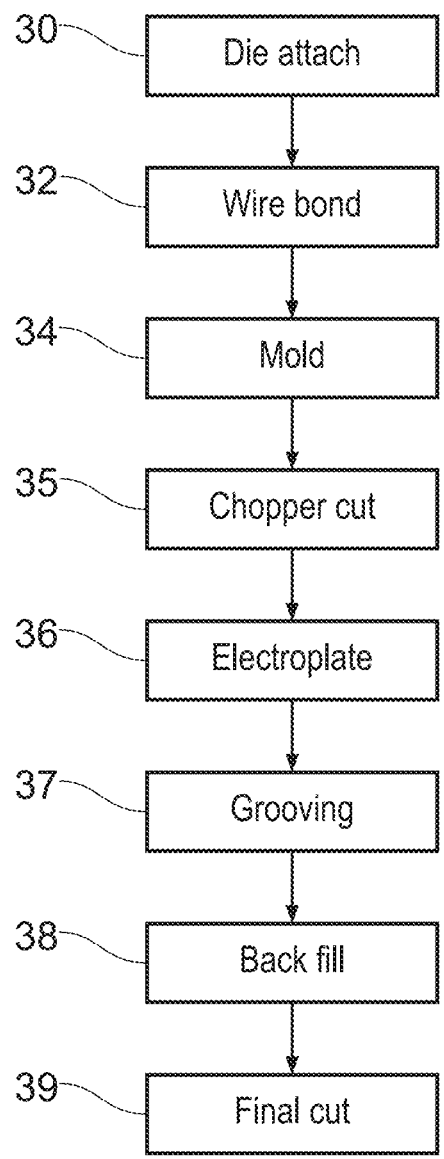
FIG. 3 illustrate a process flow diagram for forming a leadless semiconductor device according to embodiments.

FIG. 3 illustrates a process flow diagram for fabricating a leadless packaged semiconductor device according to embodiments. FIGS. 4a to 4e illustrate the process steps corresponding process flow of FIG. 3. With reference to the process flow of FIG. 3 and process flow of FIGS. 4a to 4e, following formation of the lead frame structure 20 as discussed above, device dies 40 are attached to the die attach regions 27 (shown in FIG. 2), by die bonding in the die attach step 30. The device dies 40 may be attached to the die attach regions 27 by any appropriate means, such as eutectic bonds 43 or glue adhesion 43 between the die attach region 27 and backside metallization of the device die 40. In this way a device die 40 is connected to a respective I/O terminal 25 both mechanically and electrically.

Figure 4A:
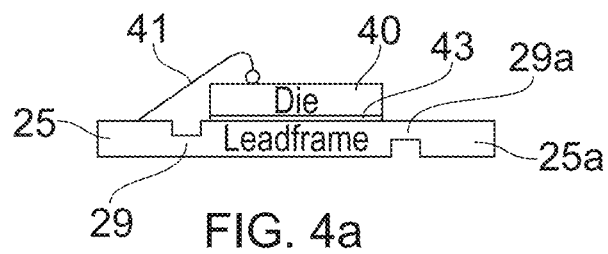
FIGS. 4a to 4e illustrate process flow steps for forming a leadless semiconductor device according to embodiments.

Also with reference to FIG. 4a, following the die bonding step 30, wire bonds 41 are connected from the contacts of the device dies 40 to the respective I/O terminals 25 of the respective lead frames 22, 28 (shown in FIG. 2) in accordance with the wire bonding process step 32 of FIG. 3. The wire bond processes can be any appropriate wire bonding process using gold copper, aluminium, or silver wire, or using metal clip bonds.

Figure 4B:
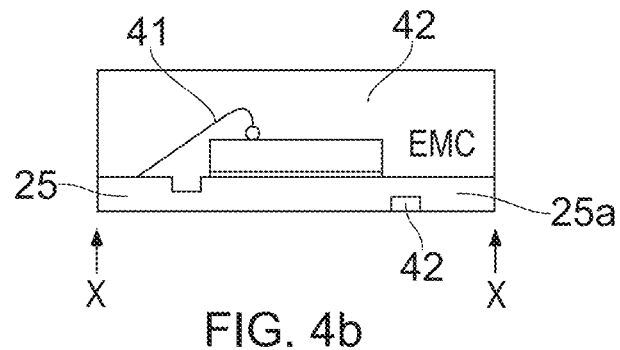

Following the wire bonding, the array of lead frames 22, 28 and device dies 40 are encapsulated in a mould compound 42 with the mold step 34 of FIG. 3, as illustrated in FIG. 4b. The encapsulation defines a first set of opposing side walls for the leadless packaged semiconductor device. This encapsulation process may be any appropriate semiconductor packaging process as understood by those skilled in the art.

Following encapsulation, a first series of parallel cuts are made in lead frame structure 20 with the chopper cut step 35 of FIG. 3, as illustrated in FIG. 4b. With reference to FIG. 2, the parallel series of cuts are singulation cuts, and are made along the horizontal or X-axis paths (X-X) following the line of the I/O terminals 25 so as to define separate rows of lead frames 22, 28. These first singulation cuts are such that the lead frames in a row of lead frames 22, 28 remain electrically and mechanically connected. Because each row of lead frames is electrically connected, it is possible to carry out electroplating of metal side pads for each of the I/O terminals 25 (shown in FIG. 2) as discussed below with the electroplate step 36 of FIG. 3, for each of the respective lead frames making up the row.

Figure 4C:
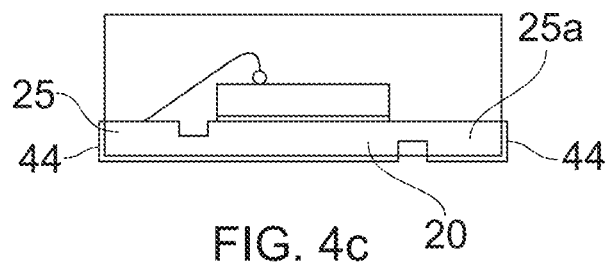

The singulation cuts also remove the encapsulation in the vicinity of the I/O terminals 25 (shown in FIG. 2) so that they can be electroplated with the electroplate step 36 of FIG. 3, to form metal side pads 44 illustrated in FIG. 4c. The electroplating can be achieved by any appropriate process as understood by those skilled in the art. Typically, the metal side pads 44 will be plated with an electroplating material such as tin or alternatively lead, or a tin-lead compound. In this way, in addition, electroplating of the metal side pads (illustrated more clearly in FIGS. 5a and 5b) on each of the I/O terminals 25 is possible. As the skilled person will also appreciate, this step of electroplating will also result in bottom surface of the lead frame structures 20 being electroplated such that the electroplating material will extend across the bottom surface between the I/O terminals 25. To ensure electrical isolation of the I/O terminals 25, such that there is no electrical continuity between respective I/O terminals in the final device the electroplating material and the tie bars 29 should be severed.

Figure 4D:
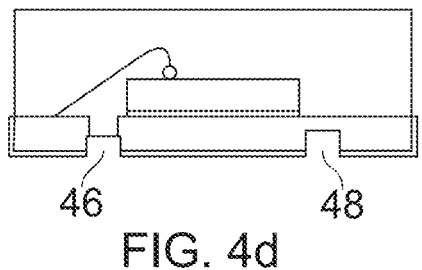

Severing of the electroplating material and the tie bars 29 is achieved by the grooving step 37 of FIG. 3, whereby one of the I/O terminals 25, as illustrated on the left side of FIG. 4d is severed from the die attach region 27 by cutting through the lead frame 20 material to form a first groove 46 which extends through to the encapsulation material 42.

Such a grooving step makes use of a typical half etch feature in the tie bars 29 material. It is a common industry design so to reduce work load on sawing process. However, it is also possible to do without the half etch, but in that case the sawing process has to cut deep into the package in order to fully remove the metal connection. Optionally, a further grooving step may be used to form a second groove 48 partially through the tie bar 29a (shown in FIG. 5a) material where the groove is formed between the die attach region 27 (shown in FIG. 2 and in FIG. 5a) and the second I/O terminal on the right side of FIG. 4d. The tie bar 29a is an alternate design of tie bars 29 and can also be designed with or without half etch feature. In an example embodiment shown in FIG. 5a, the tie bars 29 are fully severed by groves 46, and therefore no longer visible in FIG. 5a, and in that way the terminal 25 is isolated. The tie bar 29a in FIG. 5a is partially severed and remains connecting the terminal 25a with the die pad 27.

Figure 5A:
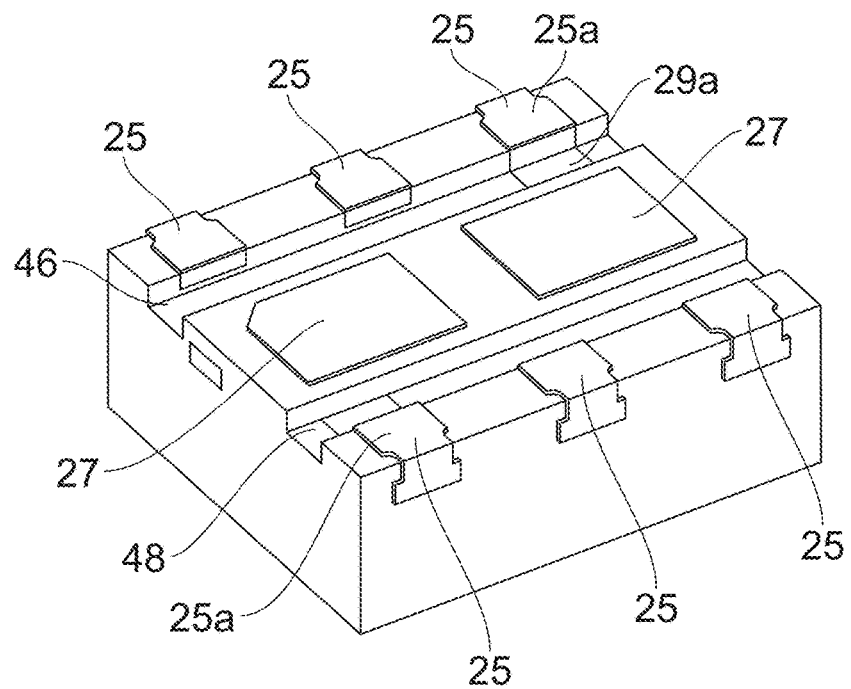
FIG. 5a illustrates the bottom view of a single device in the lead frame structure after grooving process.

Some metal side pads 44, also called terminals, e.g. terminals 25a in FIG. 5a in this two die package example, can be connected to die attach region such that one bond wire can be saved. Not all terminals on right hand side of FIG. 4d are connected to die attach region. Therefore groove 48 (as shown in FIG. 4d) is still necessary to isolate these terminals from the die attach pad.

Figure 4E:
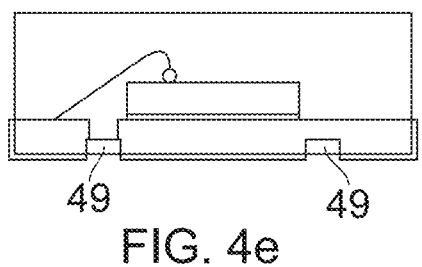

Following the grooving process of step 37 as shown in FIG. 3, the first and second grooves 46, 48 are then back filled with the back fill process step 38 with an insulating material tracks 49 as illustrated in FIG. 4e. The insulating material fills the grooves 46, 48 so to cover the lead frame material which is exposed as a result of the grooving process. The exposed lead frame metal may have smearing, due to grooving, which may shorten the gap between two exposed metals. There is a risk of electrical creepage, especially in a highly polluted environment in end user application. The back fill process step 38 secures that the backfill covers the exposed metals to prevent such an application concern. The insulating material tracks 49 as shown in FIG. 4e extend across the width of the semiconductor device and are substantially parallel from a first side wall not containing I/O terminals 25 (as shown in FIG. 2) to a second side wall not containing I/O terminals 25.

A final singulation cut is made in the process step final cut 39, as shown in FIG. 3, so to separate semiconductor devices from the rows of lead frames 22, 28 (as shown in FIG. 2) formed after the first horizontal singulation cut. The final singulation cut is made orthogonally to the first horizontal singulation cut. This final singulation cut results in a final leadless packaged semiconductor device 50 as illustrated in FIG. 5b.

Figure 5B:
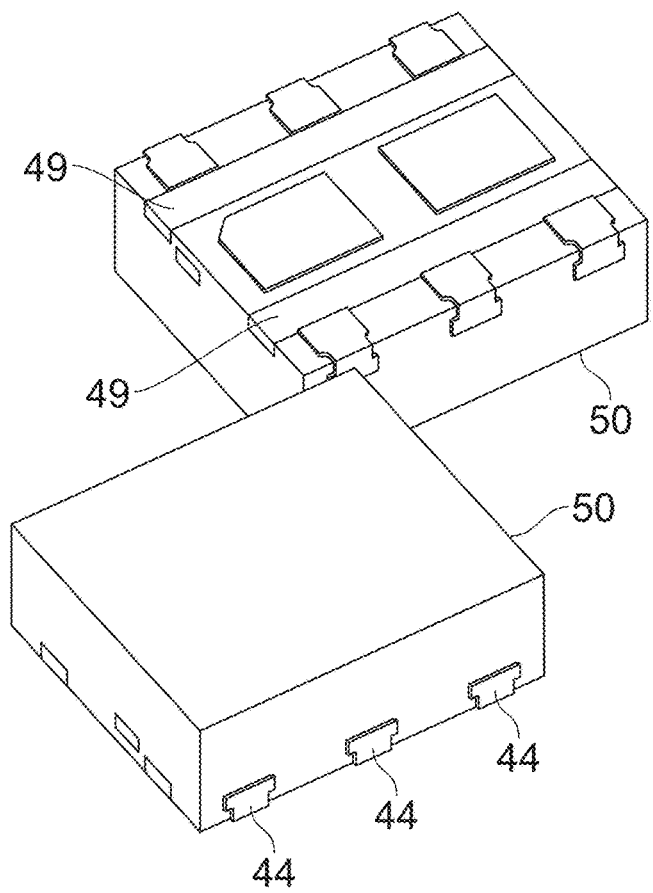
FIG. 5b illustrates respective bottom and top side views of a completed leadless packaged semiconductor device according to embodiments.

FIG. 5b illustrates respective bottom and top side views of a completed leadless packaged semiconductor device. FIG. 5b shows perspective underside view of a completed leadless semiconductor device according to an embodiment. The metal side pads 44 are formed on a side wall of the device from respective I/O terminals 25 (as shown in FIG. 2). As the skilled person will appreciate metal side pads (obscured from view in FIG. 5b) are also provided on the opposing side wall of the device. FIG. 5b also shows the insulating material 49, formed in the grooves 46, 48 (as shown in FIG. 5a) extending along the width of the underside of the semiconductor device.

Although FIG. 5b shows a two dies package, all embodiments of this disclosure are also applicable for a single die package and/or a package having more than 2 dies, in general to any logic device.

Additional processing steps may include deflashing, to remove any encapsulation compound from the I/O terminals, which may be performed before electroplating of the metal side pads. Further cleaning steps may be used to remove material from the final device following singulation. A visual inspection of the final may also be carried out. Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A leadless packaged semiconductor device comprising a top and a bottom that are opposing major surfaces and sidewalls extending between the top and bottom surfaces, the leadless packaged semiconductor device further comprising:
    a lead frame structure comprising an array of two or more lead frame sub-structures each having a semiconductor die arranged thereon;
    terminals; and
    a track extended across a width of the bottom surface of the semiconductor device from a first side wall of the semiconductor device to a second sidewall of the semiconductor device, wherein the track provides a region for interconnecting the semiconductor die and the terminals;
    wherein the track is filled by an insulating material to isolate the array of lead frame sub-structures.

2. The leadless packaged semiconductor device as claimed in claim 1, wherein each of the terminals further comprises a respective metal side pad.

3. An automotive part comprising a leadless packaged semiconductor device as claimed in claim 2.

4. A method of forming a leadless packaged semiconductor device as claimed in claim 2.

5. The leadless packaged semiconductor device as claimed in claim 1, wherein leadless packaged semiconductor device further comprises four or more terminals.

6. An automotive part comprising a leadless packaged semiconductor device as claimed in claim 5.

7. A method of forming a leadless packaged semiconductor device as claimed in claim 5.

8. The leadless packaged semiconductor device as claimed in claim 1, wherein the insulating material is an encapsulant and/or a solder mask.

9. An automotive part comprising a leadless packaged semiconductor device as claimed in claim 8.

10. A method of forming a leadless packaged semiconductor device as claimed in claim 8.

11. The leadless packaged semiconductor device as claimed in claim 1, wherein the semiconductor die and a respective terminal are connected both mechanically and electrically.

12. An automotive part comprising a leadless packaged semiconductor device as claimed in claim 11.

13. A method of forming a leadless packaged semiconductor device as claimed in claim 11.

14. The leadless packaged semiconductor device as claimed in claim 1, wherein the terminals are plated with an electroplating material selected from the group consisting of a tin, a lead, a tin-lead compound, and combinations thereof.

15. An automotive part comprising a leadless packaged semiconductor device as claimed in claim 14.

16. A method of forming a leadless packaged semiconductor device as claimed in claim 14.

17. An automotive part comprising a leadless packaged semiconductor device as claimed in claim 1.

18. A method of forming a leadless packaged semiconductor device as claimed in claim 1.

19. A method of forming a leadless packaged semiconductor device comprising a lead frame structure further comprising an array of lead frame sub-structures each having a semiconductor die arranged thereon, the method comprising the steps of:
    providing electrical connections between terminals of the array of lead frame sub-structures and the lead frame structure;
    providing an encapsulation layer to encapsulate the array of lead frame sub-structures and the respective semiconductor dies;
    performing a first series of parallel cuts extending through the lead frame structure and the encapsulation layer to expose a side portion forming terminals;
    electro-plating the terminals to form metal side pads;
    forming a groove in the lead frame structure, wherein the groove extends across a bottom surface of the leadless packaged semiconductor device;
    filling the groove with an insulating material; and
    performing a second series of parallel cuts angled with respect to the first series of parallel cuts, wherein the second series of cuts extends through the lead frame structure and the encapsulation layer to singulate the leadless packaged semiconductor device.

20. The method of forming a leadless packaged semiconductor device as claimed in claim 19, further comprising a deflashing step, to remove any remaining encapsulation layer from the terminals, wherein the deflashing step is performed before the electro-plating step.

* * * * *